United States Patent [19]

Wilson et al.

[11] Patent Number: 4,679,028
[45] Date of Patent: Jul. 7, 1987

[54] FAULT DETECTION ALGORITHM FOR SUCCESSIVE-APPROXIMATION A/D CONVERTERS

[75] Inventors: Timothy J. Wilson, Bartlett; Paul M. Erickson, Hanover Park, both of Ill.

[73] Assignee: Motorola Inc., Schaumburg, Ill.

[21] Appl. No.: 846,385

[22] Filed: Mar. 31, 1986

[51] Int. Cl.$^4$ .............................................. N03M 1/10
[52] U.S. Cl. ...................... 340/347 CC; 340/347 AD; 371/25
[58] Field of Search ............ 371/15, 25; 340/347 CC, 340/347 AD; 324/130; 364/571

[56] References Cited

U.S. PATENT DOCUMENTS 4,228,423 10/1980 Schwerdt .
4,266,292  5/1981 Regan et al. .
4,308,524 12/1981 Harrison et al. .
4,419,656 12/1983 Sloane .
4,490,713 12/1984 Mrozowski et al. .
4,498,072  2/1985 Moriyama .
4,539,683  9/1985 Hahn et al. .

OTHER PUBLICATIONS

Buhler, "Analog to Digital Converter Checking Circuit", IBM Technical Disclosure Bulletin, vol. 22, No. 8B, Jan. 1980, pp. 3618–3619.

Primary Examiner—Charles D. Miller
Attorney, Agent, or Firm—Edward M. Roney; Donald B. Southard; F. John Motsinger

[57] ABSTRACT

An improved fault detect algorithm and circuit is disclosed which quickly evaluates substantially all the elements within a successive approximation A/D converger without resorting to off-line measurements. This method utilizes a small alternating offset signal injected into the correction loop in addition to the already converted value to determine whether the elements within this loop are operating properly for any in range analog input value.

18 Claims, 6 Drawing Figures

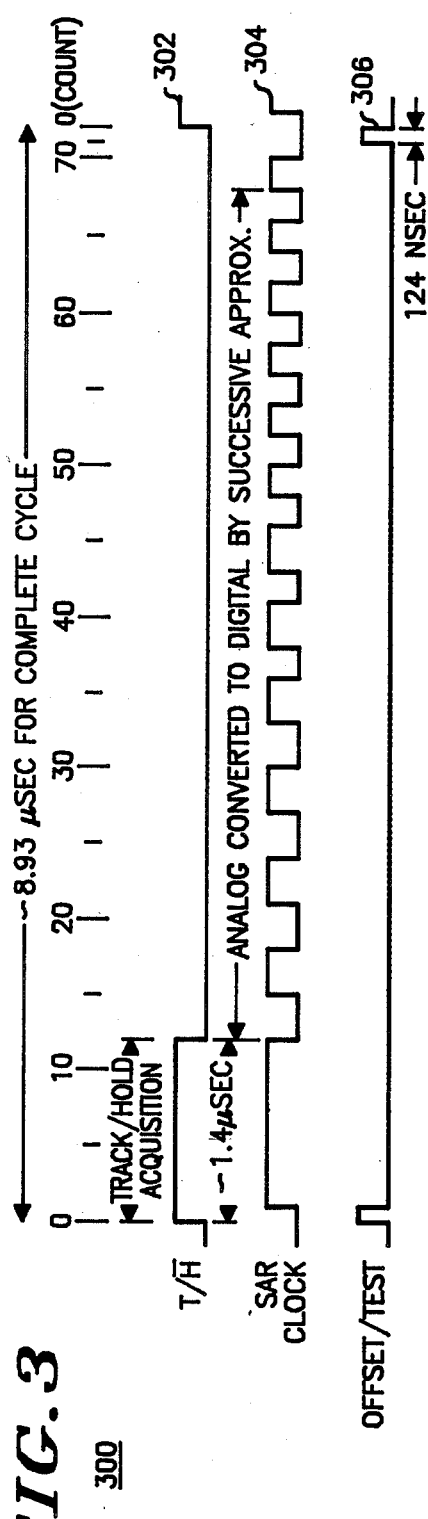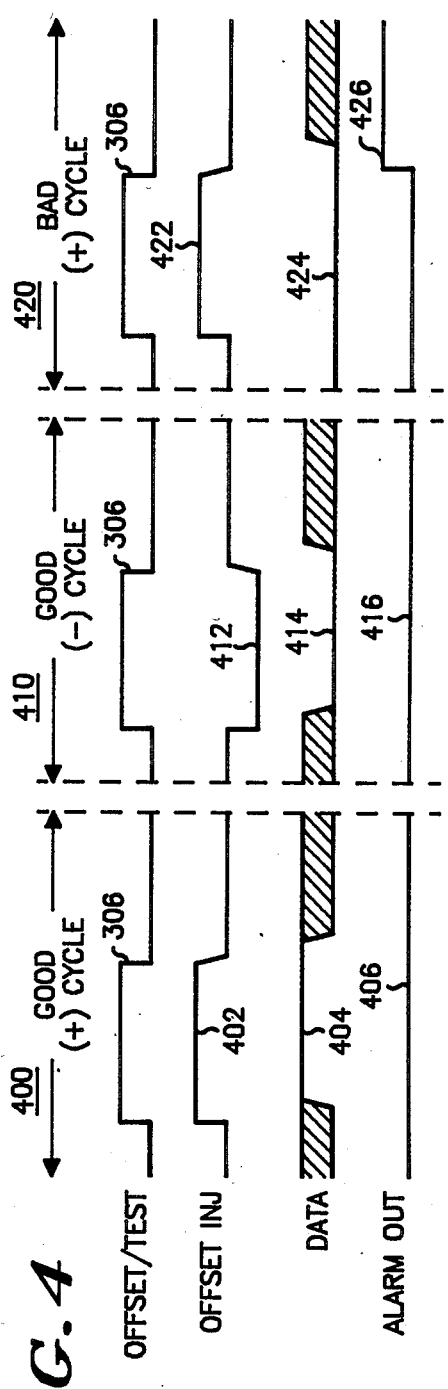

FAULT DETECTION ALGORITHM FOR SUCCESSIVE-APPROXIMATION A/D CONVERTERS

BACKGROUND OF THE INVENTION

The present invention relates generally to diagnostic testing of a successive approximation A/D (analog-to-digital) converter, and in particular to real time self-testing of a successive approximation A/D converter when incorporated into some signal processing system.

This type of A/D converter is generally used as a basic functional block which is incorporated into larger signal processing systems. Such systems may include radio communications systems where a signal or group of signals are converted to an equivalent digital signal for subsequent digital signal processing or transmission. Self-testing capability of these A/D converters is valuable for notifying a system operator or system controller that a fault exists and that prompt replacement is required. Moreover, many systems employ "hot switchover" to redundant modules which automatically effects the clearing of the faulted module within the system to reduce system interruptions even further.

In an A/D converter of the successive approximation type, an analog input signal is tracked and then held by a track/hold circuit (also known as sample/hold). While this value is being held, a register, designated a successive approximation register (SAR), controls an internal D/A converter in such a way that the D/A converter output value converges towards the held input value. This is typically accomplished by making consecutive "guesses", observing the output of the comparator to determine if the "guess" was high or low, and then making another "guess" based on that information. After each "guess", the range of uncertainty is cut in half. Thus a 12-bit successive approximation A/D converter, for example, converges to a final result by taking 12 consecutive "guesses", or successive approximations.

In the prior art, the most common method utilized for diagnostic testing of successive approximation A/D converters is to provide capability for off-line testing. Such a method relies on injecting a known analog input level at the track-and-hold input, converting it, and then observing the digital output word for the correct result. Such methods, however, are not practical for certain applications because they require successive approximation A/D converters to perform a new convergence and therefore they require an additional complete conversion cycle to be made. Moreover, they only test a successive approximation A/D converter's ability to convert one particular input value. Thus the commonly known art related to diagnostic testing of successive approximation A/D converters suffers from relatively slow speed and incomplete evaluation of the A/D converter over the entire operational range of input voltages.

Accordingly, there exists a need for an improved diagnostic testing capability for successive approximation A/D converters which evaluates substantially all components within the A/D converter while remaining on-line, and which is not restricted to one particular reference input value.

SUMMARY OF THE INVENTION

It is an object of the present invention to provide an improved self-testing apparatus for a successive approximation A/D converter which evaluates substantially all of the elements of the A/D converter and which overcomes the foregoing deficiencies.

It is a further object of the present invention to provide an improved self-testing apparatus for an A/D converter of the foregoing type having relatively high speed by evaluating the A/D converter within a fraction of a conversion cycle by applying a small alternating offset error signal to the already-converged value established at the end of the conversion cycle.

In practicing the invention, a fault detection circuit is provided that interconnects to an internal timing circuit and a comparator circuit within the A/D converter and makes judicious use of an end-of-convergence signal to effect the diagnostic self-testing of the A/D converter. Although the present invention does not directly evaluate the track-and-hold stage within the A/D converter, it does offer significant advantages in speed and in being able to evaluate the remaining stages over a wide range of input values. The fault detect circuit, upon receiving an Offset/Test command from the timing circuit, injects a small alternating offset voltage or current into an input to the comparator. This injected offset could be inputted to the summing junction node or the other input to the comparator. The sign of this offset should alternate from cycle to cycle. The size of this offset should be as small as practically possible but larger than one least significant bit. The fault detect circuit then checks the output logic level of the comparator after a short propagation delay time to see if the expected logic level caused by this small alternating offset voltage is observed. If the observed logic level is not as expected, the fault detection circuit will then indicate a failure and generate an alarm output signal via an alarm output line. The alternating sign of the injected offset voltage or current is necessary in order to determine that the comparator is not merely "hung up" in one state, but is, in fact, working within the accuracy of one least significant bit on either side of the converted A/D value. Thus, the fault detection algorithm and apparatus for self-testing an A/D converter according to the present invention overcomes the disadvantages of the known prior art.

These and other objects of the present invention will become apparent to those skilled in the art upon consideration of the accompanying specification, claims, and drawings.

BRIEF DESCRIPTION OF THE DRAWINGS

Referring to the drawings, wherein like reference numerals indicate like elements in the several figures and in which:

FIG. 3 is a timing diagram showing the various signals occurring on the designated timing source output lines in FIG. 2.

FIG. 4 is a timing diagram showing the various signals for the fault detect circuit occurring for a good (+) cycle, a good (−) cycle, and a bad (+) cycle, respectively.

DETAILED DESCRIPTION

Figure 1:
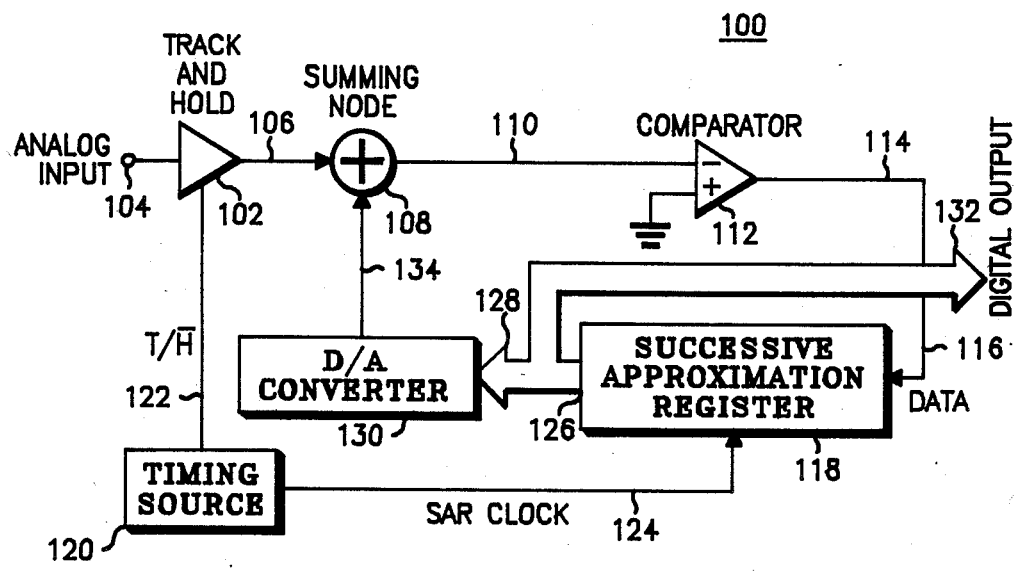
FIG. 1 is a block diagram of a typical successive approximation A/D converter.

Referring now to the drawings, a typical block diagram of a successive approximation A/D converter is shown at 100 in FIG. 1. As indicated, it includes a track-and-hold stage 102 having an analog input 104. The output 106 of the track-and-hold connects to a summing node 108, which in turn is connected to an input 110 of the comparator 112. The output 114 of the comparator is labelled "DATA" and connects to the input 116 of the successive approximation register 118. A timing source 120 having two outputs is connected to the track-and-hold stage 102 via 122 labelled T/H and also to the successive approximation register 118 via 124, labelled SAR CLOCK, as shown. The output 126 of the successive approximation register consists of parallel data lines which feed the input 128 of the internal D/A converter 130. These parallel output lines are depicted as a "bus" and together provide the digital output 132 of the A/D converter circuitry. The output 134 of the internal D/A converter 130 returns to the summing node 108, which feeds an input to the comparator. In this case, summing node 108 connects to the (−) input 110 of comparator 112. Although this is typical of successive approximation A/D converters in the known art, the summing node 108 could alternatively connect to the (+) input of comparator 112 if, for example, the D/A converter 130 had a sign reversal.

Figure 2:
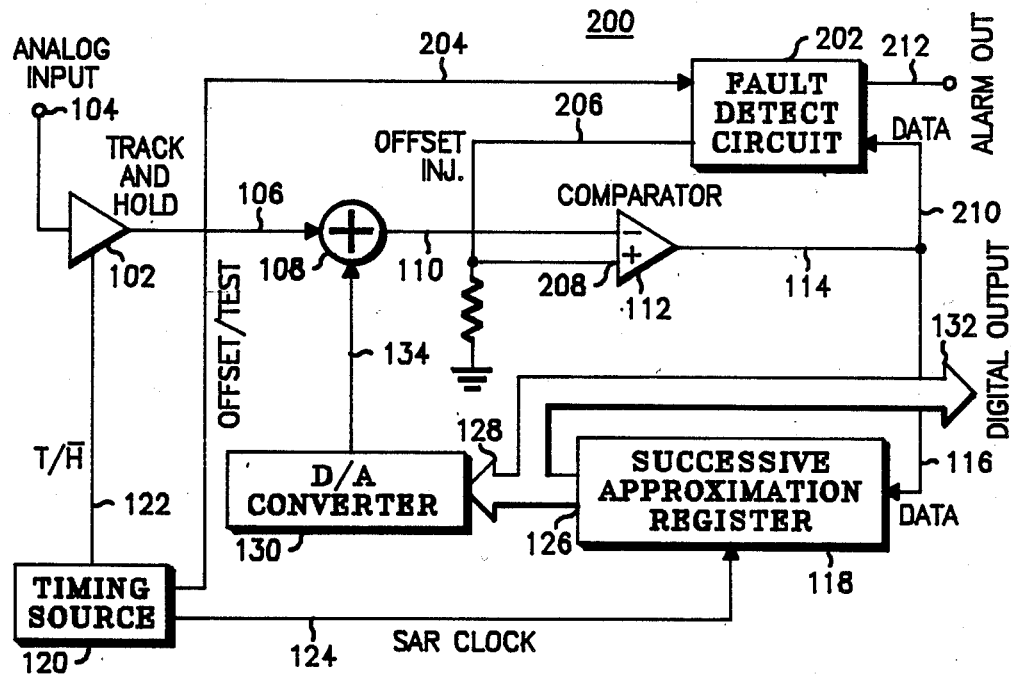
FIG. 2 is a block diagram of a typical successive approximation A/D converter having the fault detect circuit comprising the simplest form of the present invention.

In FIG. 2, the simplest form of the present invention is shown and illustrates how the fault detect circuit 202 connects via line 204 to the timing source 120 and via line 206 to an input 208 of the comparator 112, as well as via line 210 to the comparator output 114. The present invention utilizes the fact that a negative feedback loop is employed in the successive approximation A/D converter of FIG. 1. This loop provides a way to achieve self-testing at the end of the conversion process for any input value. By injecting a small alternating voltage or current as an error signal into an input of the comparator, the fault detect circuit verifies that the loop is operating properly. It does so upon command from the timing source via an Offset/Test command, and by observing the logic level of the output of the comparator. Although the simplest form of the present invention is depicted in FIG. 2 as having the offset inject signal applied to the positive input 208 of comparator 112, an alternate embodiment could have been easily implemented by changing the sign of the signal on line 206 and applying it to the summing node 108. Nevertheless, for either embodiment, if the output level observed from the comparator deviates from the expected value or level, an alarm output signal via line 212 is generated. This alarm is useful for reporting faults to a central controller or operator to minimize system "downtime." A system operator can receive an indication that a fault exists in a particular module utilizing this A/D converter fault detection algorithm and apparatus so that the module can be promptly replaced. It may also be utilized to effect "hot switchover" of a redundant module.

A basic timing diagram useful for describing the operation of the timing source and its relation to the fault detection circuit of FIG. 2 is shown in FIG. 3. This timing diagram 300 shows the various timing signals, 302, 304, and 306 emanating from the timing source which controls the track-and-hold stage, the successive approximation register, and the fault detect circuit, respectively. As shown at the end of a complete conversion cycle of approximately 8.93 microseconds, the Offset/Test command 306 occurs at the end of the conversion cycle and permits the offset inject signal to be injected during this brief time approximately 124 nanoseconds. Any alarm resulting from the operation of the fault detect circuit when a malfunction occurs in the loop (consisting of the summing node 108, comparator 112, the SAR 118, and the internal D/A converter 130) is indicated on the falling edge of this Offset/Test command interval, as shown in FIG. 3. Thus it is clear from the diagram of FIG. 3 that the fault detect circuit operates in significantly less time, or a fraction of the time of a complete conversion cycle. Moreover, it is unnecessary to operate the successive approximation A/D converter "off-line" at all, thereby overcoming the disadvantages of the known art.

The timing diagrams of FIG. 4 show the various signals relating to the fault detection circuit during a good (+) cycle at 400, a good (−) cycle at 410, and a bad (+) cycle at 420, respectively. As shown at 400, during the interval of the Offset/Test command 306, the offset inject signal 402 is shown as having a positive value. The DATA input during this time period remains high as shown at 404 in FIG. 4. Thus, the DATA line responds in a manner corresponding to the offset injected signal 402 to provide an indication that no fault exists, as shown at 406 in FIG. 4. Next, depicted at 410 in FIG. 4, the Offset/Test command pulse 306 is again shown. During this time interval, the offset injected signal now has a negative value as shown at 412. This causes the DATA line to remain low during the time interval as shown at 414. Here again, since no fault exists due to the fact that the DATA line has the expected level during the period when the offset injected signal is provided, no fault indication is shown at 416. If, however, a fault should exist and be detected during a (+) cycle for example, then the timing diagram depicted at 420 in FIG. 4 will be observed. Again, the Offset/Test command pulse 306 is shown with a positive going offset injected signal, shown as pulse 422. If the fault exists such that the DATA line remains "stuck low", shown as 424, then a fault is detected and an indication 426 is provided on the alarm out line.

Figure 5:
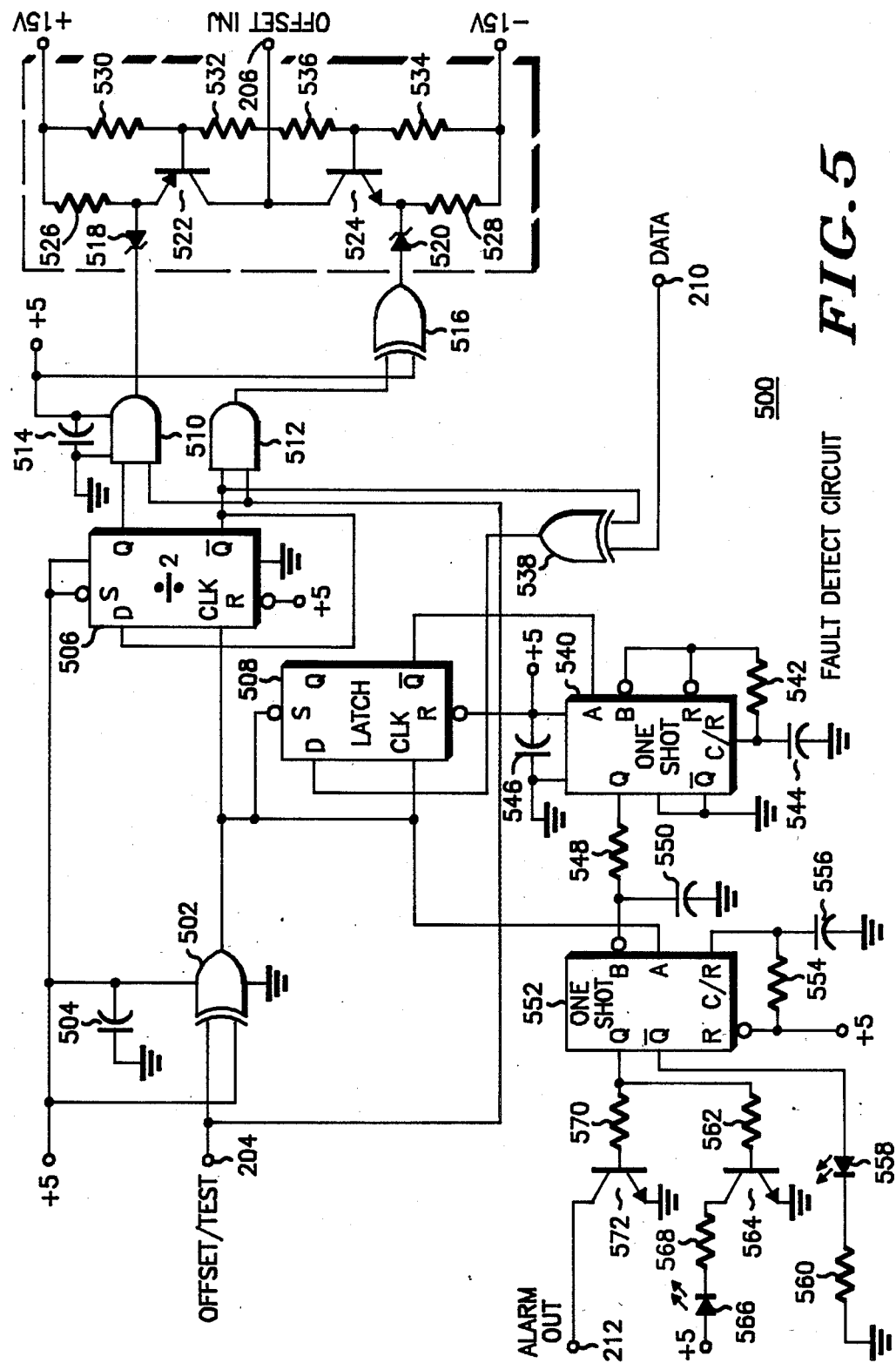
FIG. 5 is a schematic diagram showing the preferred embodiment of the present invention for the fault detect circuit as employed with a typical successive approximation A/D converter.
Figure 6:
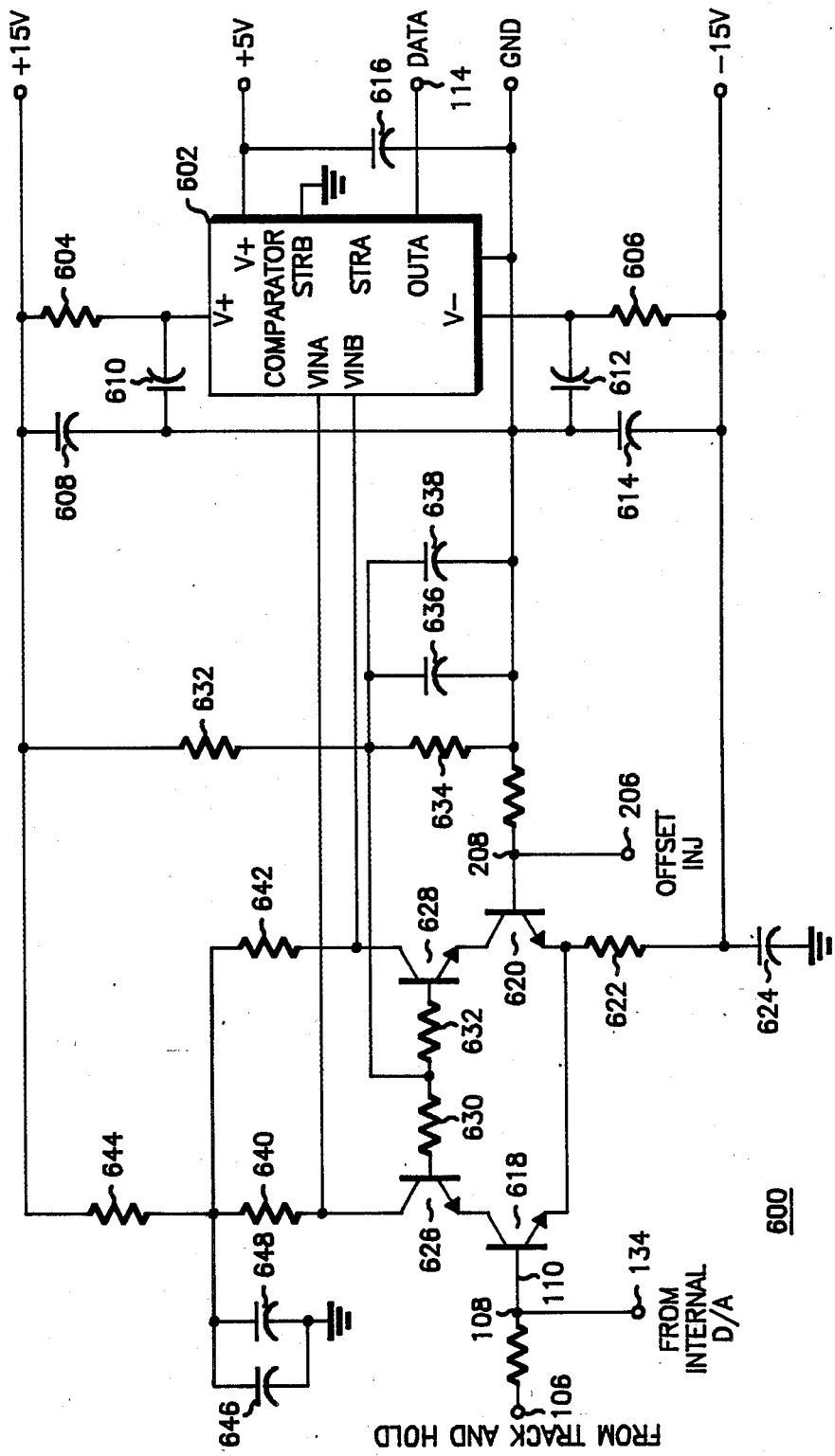
FIG. 6 is a schematic diagram of the preferred embodiment of the comparator utilized with the present invention in the successive approximation A/D converter.

A preferred embodiment of the fault detect circuit 202 of the present invention is shown at 500 in FIG. 5, and a preferred embodiment of the comparator 112 is shown at 600 in FIG. 6. Like numerals are employed for corresponding components wherever this is applicable. The preferred fault detect circuit 500 consists of an offset inject circuit having various logic elements, as shown.

The fault detect circuit contains logic elements as well as analog circuitry in order to control the injection of the offset signal and verify that the expected level is observed at the output of the comparator. The Offset/Test command, applied to the input 204 of the fault detect circuit, proceeds to inverter 502, which drives two D type flip-flops, 506 and 508 at their clock inputs. The first D type flip-flop 506 such as a Motorola type MC74HC74 acts as a divide-by-two circuit, with its outputs driving two separate AND gates 510, 512 having their supply voltage bypassed by capacitor 514.

These two AND gates provide the +INJ and −INJ control signals to the offset inject circuit in order to provide the offset injection signal at line 206. Stage 516 is used on the −INJ line as an inverter to drive the offset injection circuit. Each of these two signals then drives a zener diode, 518 and 520 respectively, which in turn drive a transistor stage to provide positive or negative control offset current. Zener diode 518 connects to the emitter of transistor 522, and diode 520 connects to the emitter of transistor 524. Each transistor has a current limiting resistor 526, 528 to limit the current drawn from the +15 volt and −15 volt supply rails. Furthermore, each transistor stage has a voltage divider 530, 532 and 534, 536 to develop a reference base voltage for each transistor at a given level between the +15 volt supply rail and ground, as well as between the −15 volt supply rail and ground, respectively. The offset injection signal developed at line 206 then proceeds to the (+) input 208 of the comparator 112. The level of the offset signal is as small as practically possible, but larger than one least significant bit of the A/D converter loop. This injected error signal then causes a corresponding change in the output 114 of the comparator, labelled DATA, and is supplied to the input of the fault detect circuit at line 210. An exclusive-OR stage 538 operates as a one-bit digital discriminator to develop an output which normally remains high and which is supplied to D type flip-flop 508 such as a Motorola type MC74HC74. Stage 508 acts as a latch which is responsive to a low level being applied to its D input. When such a level is detected, it causes a pulse from the inverted output of stage 508 to trigger one shot 540 such as a Motorola type MC74HC4538, which has a time constant established by resistor 542 and capacitor 544. Capacitor 546 bypasses the supply voltage for stage 540. The output from stage 540 then drives RC circuit 548, 550 which, in turn, drives a second one-shot 552 which may be a Motorola type MC74HC4538 having a different time constant established by resistor 554 and capacitor 556. The outputs from stage 552 are then utilized to provide an indication of normal operation via a light emitting diode 558 having a limiting resistor 560. The other output of stage 552 drives circuitry for indicating that a fault exists and provides an alarm out signal. Resistor 562 drives transistor 564, which acts as an inverter for driving light emitting diode 566 having a limiting resistor 568. In addition, resistor 570 drives a second inverting transistor 572, which provides an alarm out signal via line 212. Thus the fault detect circuit has two inputs, namely the DATA input and the Offset/Test input, and two outputs consisting of the OFFSET INJECT line and the alarm out line.

In conjunction with the preferred embodiment of the present invention, an A/D converter may utilize a preferred embodiment of a comparator configured to provide greater gain than a conventional comparator. Such a preferred comparator is shown in FIG. 6, and includes an integrated circuit comparator stage 602 such as a type NE529 fed from a dual voltage supply of +15 volts and −15 volts via resistors 604 and 606. These supply lines are bypassed and decoupled by capacitors 608, 610, 612, and 614, as shown. There is also a +5 volt supply which is bypassed by capacitor 616 for this integrated circuit comparator stage 602. This stage has a single-ended output, OUTA, which provides the DATA output on line 114, and a differential input, labelled VIN A and VIN B. Ahead of comparator 602 is an additional stage of amplification consisting of a differential pair of transistors 618, 620 having a common emitter resistor 622 which connects to the −15 volt supply and which is bypassed by capacitor 624. Feeding this differential pair are current sources made up of transistors 626 and 628, which are biased by resistors 630, 632, and which are fed from a bypassed resistive divider consisting of resistors 632, 634 with capacitors 636 and 638. The supply for these current sources is provided by the +15 volt supply feeding another set of bypassed resistors, shown here as 640, 642, and 644, with capacitors 646 and 648. The input 110 represents the (−) input to this comparator. This input connects to summing node 108 and receives signals from the track-and-hold by means of line 106 with a series resistor, and it also connects to the output from the internal D/A converter via line 134.

Thus, this fault detect circuit arrangement, like the one in FIG. 2, self-tests the successive approximation A/D converter in a fraction of the conversion cycle time. It does so for a wide range of analog input values by making use of the already-converged value within the loop. Moreover, while the fault detect circuit depicted generally in FIG. 2 could be implemented in many ways, the preferred embodiment of the present invention, as shown in FIG. 5, implements the essential features of the fault detect circuit in a straight-forward and cost-effective manner in conjunction with the comparator shown in FIG. 6. And, while this comparator circuit is one convenient way to implement the comparator function, other integrated circuit comparators having sufficient voltage gain would certainly work as well.

The remaining components in the A/D conversion loop of the preferred embodiment include the SAR or successive approximation register 118, such as a DM-2504 availble from several manufacturers, the internal D/A converter 130, such as a Burr-Brown PCM 53JG-I, and a suitable timing source 120, which may be implemented using a crystal oscillator and a plurality of frequency dividers.

In summary, each of the above mentioned arrangements is able to accomplish the self-test capability in a successive approximation A/D converter without resorting to testing the A/D converter off-line utilizing an external, accurately-controlled reference voltage and a device to check the digital output word for the correct result. Thus, each embodiment is able to achieve self-test capability in a successive approximation A/D converter by testing virtually all of the elements of the A/D converter in a fraction of an entire conversion cycle. Thus, each is able to overcome the limitations of the known art.

Although these arrangements of the present invention fully disclose many of the attendant advantages, it is understood that various changes and modifications not depicted herein are apparent to those skilled in the art. Therefore, even though the form of the above-described invention is merely a preferred or exemplary embodiment given with suggested alternatives, further variations may be made in the form, construction, and arrangement of the parts without departing from the scope of the above invention.

We claim:

1. A method for achieving self-test capability in a successive approximation A/D converter having a comparator which has accessible a pair of inputs and an output therein, the method comprising the steps of:

injecting into an input of said comparator at the end of each conversion cycle an offset having a sign that alternates for each conversion cycle and a small magnitude that slightly exceeds a level discernible as one least significant bit; and verifying that the output of the comparator shifts in a manner corresponding to the alternating sign of said injected offset, thereby achieving self-test of virtually all of the A/D converter elements over a wide range of input values in a fraction of an entire conversion cycle.

2. The method according to claim 1 wherein said step of injecting an offset includes injecting a controlled current thereto.

3. The method according to claim 1 wherein said step of injecting an offset includes injecting a controlled voltage thereto.

4. The method according to claim 1, wherein the step of verifying the output shift includes comparing the observed output logic level of the comparator to the alternating sign of said injected offset and outputting an alarm out signal if said output does not correspond to the expected output logic level thereof.

5. The method according to claim 1, wherein said step of injecting into an input includes injecting into a positive input of the comparator.

6. The method according to claim 1, wherein said step of injecting into an input includes injecting into a negative input of the comparator.

7. Apparatus for self-testing at high speed a successive approximation A/D converter having a relatively long conversion cycle and including at least a track-and-hold circuit which drives a loop consisting of a comparator, a successive approximation register, a D/A converter, and controlled by a timing source, the apparatus comprising:

offset generating means coupled to an input of the comparator and to the timing source of said A/D converter for injecting into an input of said comparator at the end of each conversion cycle an offset having a sign that alternates for each conversion cycle and a small magnitude that slightly exceeds a level discernible as one least significant bit; and verification means coupled to the output of said comparator and having an alarm output for indicating when the observed output logic level fails to correspond to the expected output logic level which is dependent on the sign of said injected offset signal, thereby achieving self-test of virtually all of the A/D converter elements over a wide range of input values in a fraction of an entire conversion cycle.

8. The apparatus according to claim 7, wherein offset generating means for injecting an offset signal into an input of the comparator comprises an offset inject circuit controlled by an offset/test command from said timing source.

9. The apparatus according to claim 7, wherein verification means for indicating when the observed output logic level fails to correspond to the expected output logic level which is dependent on the alternating sign of said injected offset signal comprises comparison means and alarm output generating means for indicating when the observed output logic level fails to correspond to the expected output logic level.

10. The apparatus according to claim 7, wherein offset generating means couples to a positive input of the comparator.

11. The apparatus according to claim 7, wherein offset generating means couples to a negative input of the comparator.

12. A successive approximation A/D converter circuit having high speed self-testing capability, the circuit comprising in combination:

a track-and-hold circuit having an analog input;

an A/D conversion loop which includes a comparator that electrically couples to an output of said track-and-hold circuit and which has a plurality of digital outputs; and a fault detect circuit electrically coupled to said comparator at its input for injecting thereto an offset having a sign that alternates for each conversion cycle and having a small magnitude that slightly exceeds a level discernible as one least significant bit, and coupled to said comparator at its output for verifying that said loop is responsive to an offset affecting a converged value within said loop, said fault detect circuit thereby providing an alarm output signal when the observed output logic level of said comparator fails to correspond to the expected output logic level thereof.

13. The circuit according to claim 12, wherein said A/D conversion loop comprises in combination:

a comparator having an output and a pair of inputs;

a successive approximation register electrically coupled to said comparator output and having a plurality of outputs;

a D/A converter coupled to said plurality of outputs from the successive approximation register and having an output coupled to an input of said comparator; and a timing source having a first output coupled to said successive approximation register, a second output coupled to said track-and-hold circuit, and a third output coupled to said fault detect circuit for controlling the timing of the successive approximation converter.

14. The circuit according to claim 12, wherein said fault detect circuit couples to a positive input of the comparator.

15. The circuit according to claim 12, wherein said fault detect circuit couples to a negative input of the comparator.

16. A fault detect circuit for self-testing at high speed a successive approximation A/D converter having a relatively long conversion cycle and including at least a track-and-hold circuit which drives a loop consisting of a comparator, a successive approximation register, a D/A converter, and a timing source, the fault detect circuit comprising in combination:

an offset inject circuit having logic elements for control and coupled to an input of the comparator and to the timing source of said A/D converter for injecting into an input of said comparator at the end of each conversion cycle an offset having a sign that alternates for each conversion cycle and a small magnitude that slightly exceeds a level discernible as one least significant bit; and a verification circuit coupled to the output of said comparator and having an alarm output for indicating when the observed output logic level fails to correspond to the expected output logic level which is dependent on the sign of said injected offset signal, thereby achieving self-test of virtually all of the A/D converter elements over a wide range of input values in a fraction of an entire conversion cycle.

17. The fault detect circuit according to claim 16, wherein said offset inject circuit comprises a bipolar current source including two transistors, a divide-by-two flip-flop, and logic gates to permit control from the timing source.

18. The fault detect circuit according to claim 16, wherein said verification circuit comprises a one-bit digital discriminator such as an exclusive-OR gate, a latch formed by a flip-flop, and a plurality of one-shots to provide a plurality of alarm output signals.

* * * * *